United States Patent [19]

Gatto et al.

[11] 4,423,468
[45] Dec. 27, 1983

[54] DUAL ELECTRONIC COMPONENT ASSEMBLY

[75] Inventors: Donald F. Gatto, Sunrise; Juan Milciunas, Ft. Lauderdale, Fla.

[73] Assignee: Motorola, Inc., Schaumburg, Ill.

[21] Appl. No.: 374,667

[22] Filed: May 4, 1982

Related U.S. Application Data

[63] Continuation of Ser. No. 192,590, Oct. 1, 1980, abandoned.

[51] Int. Cl.$^3$ .......................... H05K 7/06; H05K 1/14
[52] U.S. Cl. ................................ 361/404; 174/52 FP; 361/396; 361/408; 361/414
[58] Field of Search ............... 361/380, 386, 395, 396, 361/400, 401, 403, 404, 408, 410, 412, 414, 415; 174/52 FP

[56] References Cited

U.S. PATENT DOCUMENTS 3,483,308 12/1969 Wakely ................................ 361/403
4,288,841 9/1981 Gogal ................................ 361/414
4,320,438 3/1982 Ibrahim et al. ................. 361/408 X

FOREIGN PATENT DOCUMENTS 1446305 6/1966 France ................................ 361/401

Primary Examiner—R. R. Kucia
Attorney, Agent, or Firm—Joseph T. Downey; Margaret M. Parker; James W. Gillman

[57] ABSTRACT

Two related miniature components are attached to opposite sides of an insulating base member. There are conductive pads and through-holes in the base member. The conductive areas on each component are wire-bonded to adjacent conductive areas on the base member. Some of the latter are coupled to the bottom surface of the assembly but the connections between the two components are made via metallization in the through-holes. Insulating covers seal each side of the assembly and the entire assembly may be reflow soldered to external circuitry.

2 Claims, 6 Drawing Figures

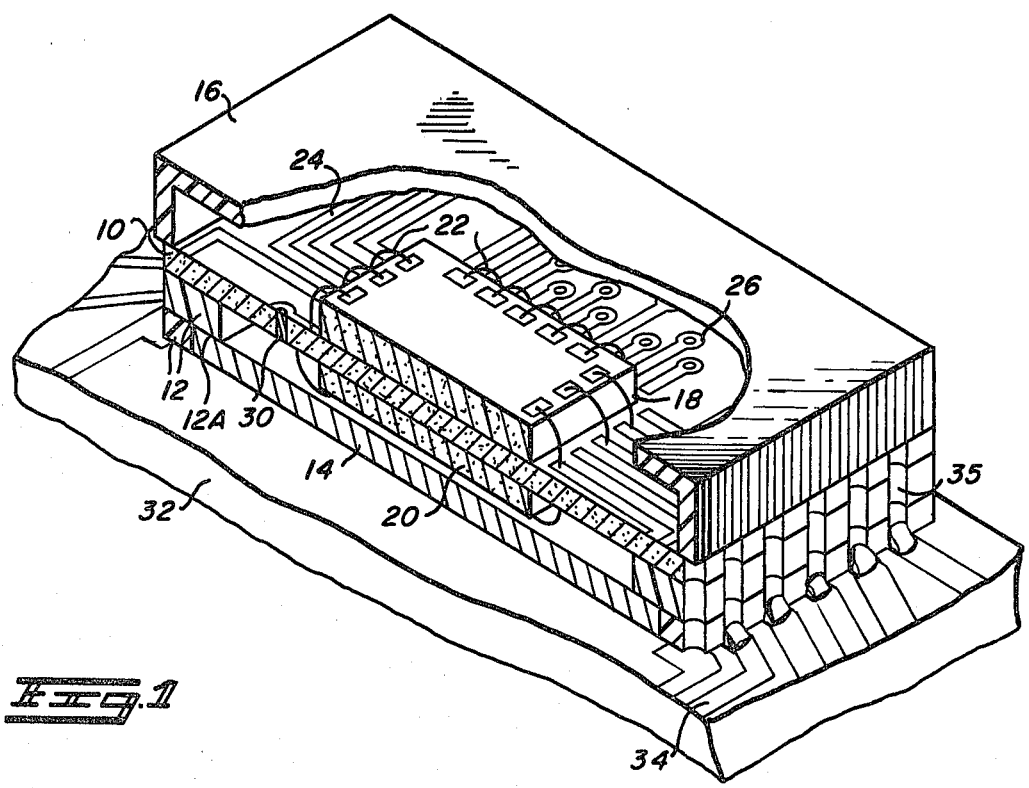
Fig. 1
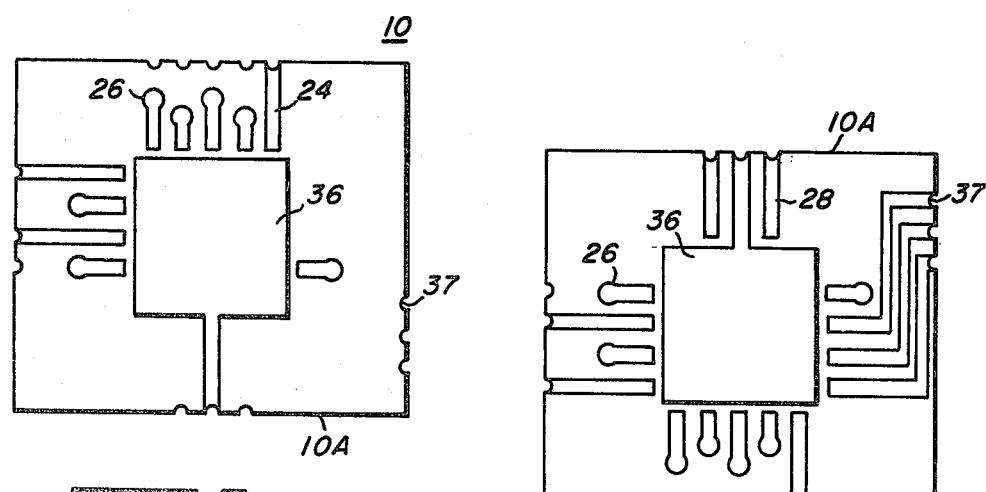
Fig. 2A
Fig. 2B

DUAL ELECTRONIC COMPONENT ASSEMBLY

This is a continuation of application Ser. No. 192,590, filed Oct. 1, 1980, now abandoned.

BACKGROUND OF THE INVENTION

This invention relates to the field of miniature component assemblies and, more particularly, to an assembly for containing at least two components with internal connections between the two as well as external connections from each one.

In the field of miniature electronic devices, the steady reduction in housing volume has produced smaller components and tighter packing of components. For components such as integrated circuits, chip carriers have been devised for ease of handling and mounting but, since the carrier must be considerably larger than the IC chip, there is still much wasted space. In devices requiring very high speed operation, the distance between terminals may be significant, and the prevention of unwanted signal pickup may also be important. Devices are known which include a two-sided substrate and relatively large lead-in connections which project in through potted cavities in the outer wall of the carrier and have surfaces available to both chips. Such lead-ins would be satisfactory if all interconnections are also required to be external connections and the size of the lead-ins would not effect the operation of the mounted components, but such large, potted-in lead-ins are otherwise unsatisfactory as well as cumbersome to produce.

SUMMARY OF THE INVENTION

It is therefore an object of the present invention to provide a means of mounting two components in the normal mounting area of one such component.

It is a particular object to provide for short internal connections between certain terminals of the two components as well as providing external connection points.

These objects, and others which will become apparent, are achieved in the assembly of the present invention by attaching one component to the central area on each side of an insulating base member. There are conductive areas on each side of the base member which reach from near the edge of the component to the edge of the base member and continue to the exterior of the housing. Conductive terminals on the components are wire-bonded to adjacent conductive areas on the base. Connections between the two components are made by wire bonds to other adjacent conductive areas which are connected by plated feed-throughs or metal vias which penetrate the base member, making for very short lead lengths. An insulating frame member surrounds one of the components and its associated wire bonds on the lower surface of the base member and has a shoulder portion to receive a sealing cover. An insulating cover or lid is sealed to the upper surface and fits over the other of the components and its associated wire bonds. The entire assembly may be pretested and then reflow soldered to a printed circuit board or other substrate containing circuitry thereon.

BRIEF DESCRIPTION OF THE DRAWING

FIG. 1 is a cut-away perspective view of an assembly completed and mounted in accordance with the present invention.

FIGS. 2A and 2B are plan views of both major surfaces of only the base member of FIG. 1.

DETAILED DESCRIPTION OF THE PREFERRED EMBODIMENT 24, 26

Figure 3A:
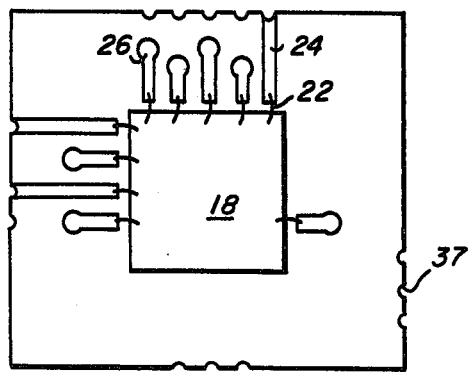
FIGS. 3A and 3B are plan views as in FIGS. 2A and 2B with the base member and components assembled.

In the cut-away view of FIG. 1 may be seen an insulating base member or substrate 10, a frame member 12, a flat cover 14 and a raised cover 16, all of which may be formed of alumina or other suitable insulating material. The frame member 12 may be formed in two sections, as shown, or as one piece having a shoulder portion 12A. In either case, the flat cover 14 is received and sealed in the frame member. On each side of the base member 10, a small component 18, 20 (such as a microprocessor and its associated ROM) is seen, coupled by wire bonds 22 to conductive areas 24,26 (and 28, see FIG. 2B). This configuration of conductive areas has no particular significance, but would normally be more complex, and would be customized for such components as a microprocessor and ROM. The conductive areas 26 include "vias" 29 of solid metal through the base member 10, although it is not required that the vias be solid. The entire assembly is shown on a printed circuit board 32 bearing connective paths 34 to which the assembly may be reflow soldered. The conductive areas 24, 28 are coupled to the paths 34 by way of conductive areas 35 down the edges of the base member 10 and the edges and one surface of the frame member 12.

FIGS. 2A, 2B show the major surfaces of the base member 10 with the conductive areas in place. Conductive areas 36 serve as ground plane connections. These conductive areas may be applied by any satisfactory method. In FIG. 2B, the base member 10 has been rotated 180° downward as indicated by the positions of edge 10A. As is well known, the process of making substrates such as the base member 10 normally involves forming a large thin layer of alumina, providing holes (seen here as half circles 37), putting on conductors which extend through the holes to the lower surface, then cutting through the holes to provide the individual base members 10. In the present invention, the conductors 24 and 28 extend from near the edge of the mounting area for the components 18, 20 to the edge of the base 10. The conductive areas 35 continue these paths down the edges of the base and the frame member 12 through the half circles 37 and onto the lower surface of the frame. The positions of the conductors 26 on one side of the base member 10 will be seen to correspond to the corresponding positions on the opposite side.

Figure 3B:
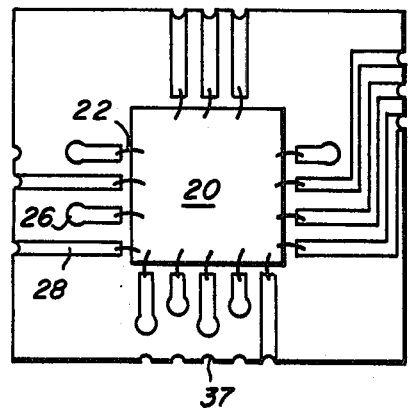

In FIGS. 3A and 3B, the base member 10 is seen as in FIGS. 2A, 2B but with components 18, 20 and wire bonds 22 in place. Those portions of the components requiring connection to external circuitry are wire-bonded to conductors 24, 28 which eventually couple to conductors 34 of the printed circuit board 32 or other such supporting element. However, those portions of the components 18 which are only coupled to portions of the component 20 are bonded to the smaller conductors 26 which include the vias 30. Thus the interconnections are extermely short and provide little opportunity for pickup of extraneous signals. Also, as is known, the length of the pads between such components as a microprocessor and its associated memory (ROM) has an effect on the operation of these devices.

Figure 4:
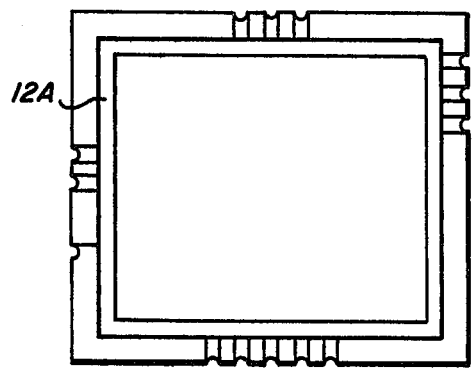
FIG. 4 is a plan view of the frame member of FIG. 1.

In FIG. 4, the frame member 12 is seen as it would be positioned on the side of the base member 10 as seen in FIG. 3B. The visible portions of the conductive areas 35 will contact mating areas of the conductive pads 34 and may be reflow soldered as is known in the art. As mentioned hereinabove, the frame member 12 may consist of two separate frames with different aperture dimensions, thus providing the shoulder portion 12A to support the flat cover 14.

In the preferred embodiment of the invention, the components 18, 20 would be attached to the base member 10 by an epoxy which is subsequently cured for permanent adhesion. Wire bonds are then made as required and the flat cover 14 and raised cover 16 are sealed in place. The cover 16 is shown as an open box-like element but could, of course, be constructed as are the frame member 12 and flat cover 14, but lacking any conductive areas.

Thus, there has been shown and described an improved means of mounting two electronic components in the space of one, with reduced lead lengths and pickup of extraneous signals.

What is claimed is:

1. An electronic circuit assembly comprising:
   an insulating base member having a plurality of through-holes adjacent a central area;
   a first plurality of conductive areas on at least one major surface of the base member and each extending from adjacent the perimeter of said central area to an edge of the member;
   a second plurality of conductive areas each extending from the perimeter of said central area on one major surface of the base member to and through one of said through-holes to the perimeter of the central area on the other of the major surfaces;
   a first semiconductor component affixed to the central area on one major surface of the base member and including conductive portions;
   a second semiconductor component affixed to the central area on the other major surface of the base member and including conductive portions;
   wire bonds for connecting the conductive portions of the first and second semiconductive components to conductive areas on the respective major surfaces of the base member;
   an insulating frame member having a bottom side attached to one major surface of the base member and having essentially the same outer dimensions, having a central aperture dimensioned to expose the first semiconductor component and the associated wire bonds;
   a third plurality of conductive areas on the edges of the insulating members and adapted to couple to ones of the first plurality of conductive areas, each of the third plurality of areas extending onto the top side of the frame member;
   a first insulating cover means sealingly attached to the second surface of the base member and having a central recess for enclosing the second semiconductor component and the wire bonds attached thereto; and
   a second cover means dimensioned to be sealingly attached within a portion of the central aperture of the frame member.

2. An electronic circuit assembly in accordance with claim 1 and wherein the central area on at least one major surface is a conductive area and includes a conductive portion extending to the top side of the frame member and further wherein at least one of the components is conductively attached to the respective central area.

* * * * *